US012772735B2

(12) United States Patent
Schary et al.

(10) Patent No.: US 12,772,735 B2
(45) Date of Patent: Oct. 20, 2026

(54) METHOD FOR PRODUCING A MICRO-ELECTROMECHANICAL OSCILLATORY SYSTEM AND PIEZOELECTRIC MICROMACHINED ULTRASONIC TRANSDUCER

(71) Applicant: Robert Bosch GmbH, Stuttgart (DE)

(72) Inventors: Timo Schary, Aichtal-Neuenhaus (DE); Johannes Baader, Haslach (DE); Reinhold Roedel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 651 days.

(21) Appl. No.: 18/547,202

(22) PCT Filed: Apr. 7, 2022

(86) PCT No.: PCT/EP2022/059290
§ 371 (c)(1),
(2) Date: Aug. 21, 2023

(87) PCT Pub. No.: WO2022/248110
PCT Pub. Date: Dec. 1, 2022

(65) Prior Publication Data

US 2024/0155947 A1 May 9, 2024

(30) Foreign Application Priority Data

May 28, 2021 (DE) ..................... 10 2021 205 485.4

(51) Int. Cl.
*H10N 30/03* (2023.01)
*B06B 1/06* (2006.01)

(52) U.S. Cl.
CPC ........... *H10N 30/03* (2023.02); *B06B 1/0644* (2013.01)

(58) Field of Classification Search
CPC .. H10N 30/03; H10N 30/071; H10N 30/2047; H10N 30/706; B06B 1/0644; B06B 1/0651
See application file for complete search history.

(56) References Cited

U.S. PATENT DOCUMENTS 9,745,188 B1 * 8/2017 Dehe ..................... B81B 3/0072
12,195,327 B2 * 1/2025 Giusti ................... B81B 3/0021
(Continued)

FOREIGN PATENT DOCUMENTS

CN 208116116 U 11/2018
CN 209367796 U 9/2019
(Continued)

OTHER PUBLICATIONS

International Search Report for PCT/EP2022/059290, Issued Jul. 15, 2022.
(Continued)

*Primary Examiner* — Emily P Pham
(74) *Attorney, Agent, or Firm* — Norton Rose Fulbright US LLP

(57) ABSTRACT

A method for producing a micro-electromechanical oscillatory system. A carrier substrate with a first surface is provided and a first passivation layer is applied onto the first surface. A first polysilicon layer grows on top of the first passivation layer and/or the first surface of the carrier substrate and a second passivation layer is applied onto a second surface of the first polysilicon layer. A second polysilicon layer grows on top of the first polysilicon layer and/or the second passivation layer. A transducer element is applied onto a third surface of the second polysilicon layer. A first trench is produced through the carrier substrate and the first polysilicon layer in the direction of the transducer element. The first trench extends as far as the second passivation layer, such that an oscillatable transducer plate
(Continued)

of the micro-electromechanical oscillatory system is produced adjoining the first trench using the second polysilicon layer.

15 Claims, 5 Drawing Sheets

(56) References Cited

U.S. PATENT DOCUMENTS

| | | | | |
|---|---|---|---|---|
| 2001/0035700 | A1 | 11/2001 | Percin et al. | |
| 2002/0001871 | A1 | 1/2002 | Cho et al. | |
| 2002/0105250 | A1 | 8/2002 | Klee et al. | |
| 2012/0025337 | A1 | 2/2012 | Leclair et al. | |
| 2020/0194658 | A1 * | 6/2020 | Guedes | H10N 30/883 |

FOREIGN PATENT DOCUMENTS

| | | | |
|---|---|---|---|
| DE | 102008026886 | A1 | 12/2009 |
| EP | 3233311 | A1 | 10/2017 |
| WO | 2016106153 | A1 | 6/2016 |

OTHER PUBLICATIONS

Muralt P et al., "Piezoelectric Micromachined Ultrasonic Transducers Based on PZT Thin Films," IEEE Transactions on Ultrasonics Ferroelectrics Frequency Control, IEEE, vol. 52, No. 12, 2005, pp. 2276-2288. <https://sci-hub.ru/10.1109/tuffc.2005.1563270> Downloaded Aug. 16, 2023.

* cited by examiner

METHOD FOR PRODUCING A MICRO-ELECTROMECHANICAL OSCILLATORY SYSTEM AND PIEZOELECTRIC MICROMACHINED ULTRASONIC TRANSDUCER

BACKGROUND INFORMATION

A method for producing a piezoelectric micromachined ultrasonic transducer (pMUT) is described in PCT Patent Application No. WO 2016/106153, in which method a passivation layer is deposited onto a carrier substrate and then patterned with the desired plate dimensions of the subsequently generated transducer plate of the pMUT sensor. A polysilicon layer is subsequently deposited onto the carrier substrate and/or the passivation layer and then a transducer element is arranged on the surface thereof. Then a trench is produced, by trenching, right through the carrier substrate until the polysilicon layer is reached.

However, in the above-described method, the trench produced has an undercut in the direction of the transducer element.

An object of the present invention is to develop a method for producing a micro-electromechanical oscillatory system which avoids such an undercut.

SUMMARY

To achieve this object, a method is provided for producing a micro-electromechanical oscillatory system, in particular a piezoelectric micromachined ultrasonic transducer, having features of the present invention. In addition, a piezoelectric micromachined ultrasonic transducer is provided.

According to an example embodiment of the present invention, in the method for producing a micro-electromechanical oscillatory system, in particular a piezoelectric micromachined ultrasonic transducer, first of all a carrier substrate with a first surface is provided. The carrier substrate in particular comprises a silicon substrate. Thereafter, a first passivation layer is applied onto the first surface of the first carrier substrate. Then a first polysilicon layer grows on top of the first passivation layer and/or the first surface of the carrier substrate. In particular, the first polysilicon layer grows epitaxially on top of the first passivation layer and/or the first surface of the carrier substrate. Thereafter, a second passivation layer is applied onto a second surface of the first silicon layer. The second surface is here in particular oriented substantially parallel to the first surface of the first carrier substrate. Then a second polysilicon layer grows on top of the first polysilicon layer and/or the second passivation layer. In particular, the second polysilicon layer grows epitaxially on top of the first polysilicon layer and/or the second passivation layer. Thereafter, a transducer element of the micro-electromechanical oscillatory system, in particular of the piezo element of the piezoelectric micromachined ultrasonic transducer, is applied onto a third surface of the second polysilicon layer. The third surface is in particular oriented substantially parallel to the first surface of the first carrier substrate. In addition, a first trench is produced right through the carrier substrate and through the first polysilicon layer in the direction of the transducer element. The first trench extends here as far as the second passivation layer, such that an oscillatable transducer plate of the micro-electromechanical oscillatory system is produced adjoining the first trench by means of the second polysilicon layer. The transducer plate here preferably directly adjoins an end of the first trench. Thanks to the two passivation layers, which are arranged on different polysilicon layers and thus different planes, the method enables more precise positioning and more precise dimensions of the transducer plate produced. The first passivation layer here serves as a type of aperture opening, through which the trench extends until the second passivation layer is reached.

According to an example embodiment of the present invention, following the step of growing the first polysilicon layer on top of the first passivation layer and/or the first surface of the carrier substrate, a circumferential second trench, in particular produced by trenching, is produced through the first polysilicon layer. An area of the second surface enclosed by the circumferential second trench here has a defined shape and size. The defined shape and size are preferably a shape and size, in particular a length, of the transducer plate to be produced in plan view. During the step of applying the second passivation layer onto the second surface of the first polysilicon layer, the second circumferential trench is preferably filled at least in part with the second passivation layer and closed by the second passivation layer, in particular at an upper end of the second trench. By filling the second trench at least in part with the second passivation layer, the method enables precise definition of the length of the transducer plate to be produced. The second trench preferably extends as far as the first passivation layer. A type of closed shape is thus produced for the second channel inside the first polysilicon layer.

According to an example embodiment of the present invention, following application of the second passivation layer onto the second surface of the first polysilicon layer, the second passivation layer is preferably removed in part by means of a first etching mask such that the second passivation layer remains only in a contiguous first sub-region of the second passivation layer. The first sub-region here has, in particular in plan view, a shape and area which correspond to the oscillatable transducer plate to be produced. The first trench here preferably extends as far as the first sub-region of the second passivation layer. The area of the second surface enclosed by the circumferential second trench and the contiguous first sub-region of the second passivation layer preferably match. In other words, the opening of the second trench is arranged at an external peripheral region of the first sub-region of the second passivation layer.

According to an example embodiment of the present invention, following the step of applying the first passivation layer onto the first surface of the first carrier substrate, the first passivation layer is preferably removed in a second sub-region of the first passivation layer by means of a second etching mask. The removed second sub-region of the first passivation layer, in particular in plan view, has a shape and area which correspond to the oscillatable transducer plate to be produced. This enables direct growth of the first polysilicon layer on top of the first surface of the carrier substrate.

According to an example embodiment of the present invention, in the step of producing the first trench, first of all a trenching step is preferably performed in which a fourth opening of an associated fourth trench mask has an opening size which is smaller, in particular significantly smaller, than the size of an area of the transducer plate. In a following isotropic silicon etching step, the first trench is enlarged, in particular until the second passivation layer is reached. Using this method, undercuts or steps of the first trench are avoided in the region of the first polysilicon layer.

The first and/or second passivation layers preferably serve as etch stop layers. The first and/or second passivation layers preferably take the form of silicon oxide layers.

According to an example embodiment of the present invention, following production of the first trench, the first and second passivation layers are preferably removed at least in part.

The present invention further provides a piezoelectric micromachined ultrasonic transducer, which is preferably produced using the above-described method. According to an example embodiment of the present invention, the piezoelectric micromachined ultrasonic transducer here has a carrier substrate, a first polysilicon layer, a second polysilicon layer, a first passivation layer, a transducer element and an oscillatable transducer plate. The carrier substrate is in particular made from silicon. The carrier substrate has a first surface, on which the first polysilicon layer is at least in part arranged. The first surface of the carrier substrate and the first polysilicon layer are separated from one another at least in part by the first passivation layer. The first polysilicon layer in turn has a second surface, which is oriented in particular substantially parallel to the first surface of the first carrier substrate. The second polysilicon layer is arranged on the second surface and the transducer element, in particular the piezo element, of the piezoelectric micromachined ultrasonic transducer is arranged on a third surface of the second polysilicon layer. The third surface is in particular oriented substantially parallel to the first surface of the first carrier substrate. A first trench, in particular produced by trenching, extends in the direction of the transducer element right through the carrier substrate and the first polysilicon layer as far as the second polysilicon layer. By way of the trench, the oscillatable transducer plate is formed directly adjoining the first trench. The oscillatable plate is formed from the second polysilicon layer.

According to an example embodiment of the present invention, the first trench preferably has a main direction of extension, which is oriented substantially perpendicular to the first surface of the first carrier substrate.

According to an example embodiment of the present invention, the first trench is preferably narrower in a region of the first polysilicon layer than in a region of the carrier substrate. In particular, the first trench has a smaller diameter in the region of the first polysilicon layer than in the region of the carrier substrate. Accordingly, the first trench has a change in cross-section, in particular a reduction in cross-section. Thus, the first trench does not have any undercuts.

According to an example embodiment of the present invention, the first polysilicon layer preferably has a first thickness in a range from 10 μm to 80 μm and the second polysilicon layer a second thickness in a range from 2 μm to 80 μm. The transducer plate produced from the second polysilicon layer thus has a shape geometrically determined by the second trench or by the first passivation layer. The first polysilicon layer increases the material thickness circumferentially around the transducer plate and constitutes the mechanical bearing arrangement for the plate.

DETAILED DESCRIPTION OF EXAMPLE EMBODIMENTS

Figure 1:
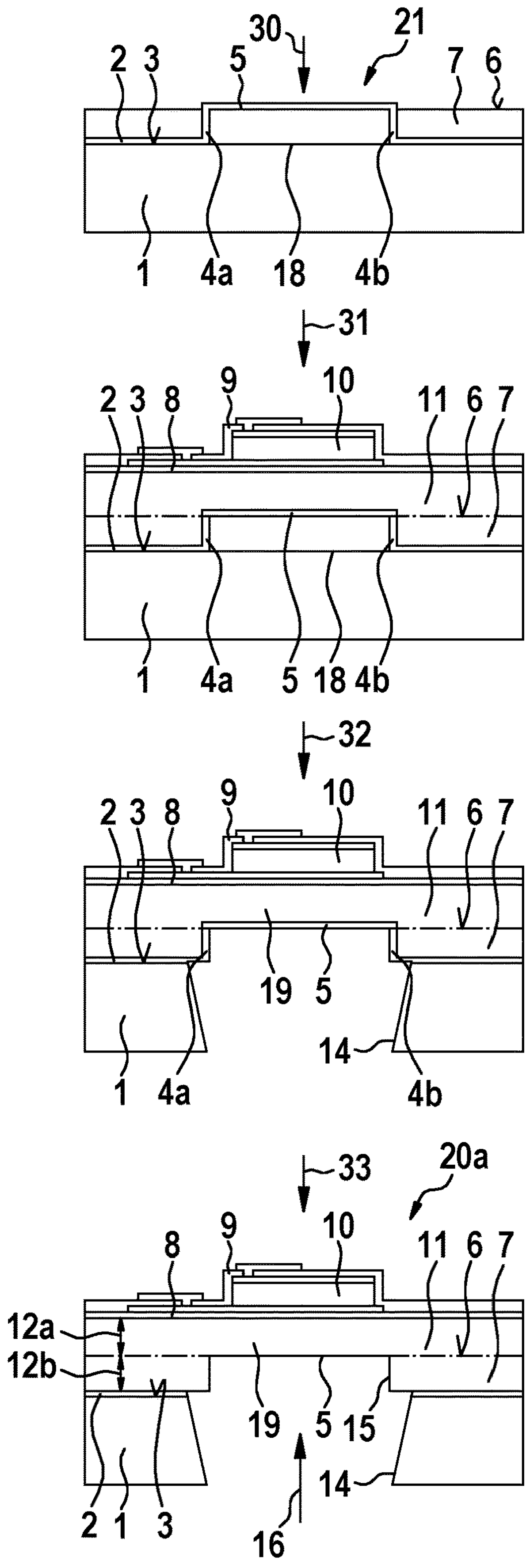
FIG. 1 shows a first embodiment of a method for producing a micro-electromechanical oscillatory system, according to the present invention.

FIG. 1 is a schematic representation of a first embodiment of a method for producing a micro-electromechanical oscillatory system. In this case, the micro-mechanical-oscillatory system is a piezoelectric micromachined ultrasonic transducer. In a first method step 30, a carrier substrate 1 is provided and subsequently a first passivation layer 2 is applied onto the first surface 3 of the first carrier substrate 1. Thereafter, in this first exemplary embodiment, the first passivation layer 2 is removed in a second sub-region 18 of the first passivation layer 2 by means of a second etching mask, not shown here. The second sub-region 18 of the first passivation layer 2 here has a shape and an area which correspond to the subsequently to be produced oscillatable transducer plate 19. Thereafter, a first polysilicon layer 7 grows on top of the first passivation layer 2 and the first surface of the carrier substrate 1. Furthermore, following the step of growing the first polysilicon layer 7, a circumferential second trench 4*a* and 4*b* is produced through the first polysilicon layer 7. The circumferential second trench 4*a* and 4*b* is a trench produced by trenching. In plan view, an area of the second surface 6 enclosed by the circumferential second trench 4*a* and 4*b* here has the shape and size of the oscillatable transducer plate 19 to be produced. The second trench 4*a* extends as far as the first passivation layer 2. Furthermore a second passivation layer 5 is applied onto a second surface 6 of the first silicon layer 7. The second surface 6 is here oriented substantially parallel to the first surface 3 of the first carrier substrate 1. During the step of applying the second passivation layer 5 onto the second surface 6 of the first polysilicon layer 7, the second circumferential trench 4*a* and 4*b* becomes filled at least in part with the second passivation layer 5 and is closed by the second passivation layer 5 at an upper end, in particular an opening, of the second trench 4*a* and 4*b*. Thereafter, the second passivation layer 5 is removed in part by means of a first etching mask (not shown here) in such a way that the second passivation layer 5 only remains in a contiguous first sub-region 21 of the second passivation layer 5. The first sub-region here has a shape and a size, in particular length, which correspond to the subsequently to be produced oscillatable transducer plate 19.

In a following method step 31, a second polysilicon layer 11 grows on top of the second surface 6 of the first polysilicon layer 7 and the second passivation layer 5. In addition, a transducer element 10 of the piezoelectric micromachined ultrasonic transducer is applied onto a third surface 8 of the second polysilicon layer 11. The third surface 8 is here oriented substantially parallel to the first surface 3 of the first carrier substrate 1. The transducer element 10 in this case is a piezo element, which is additionally electrically connected by means of electrical contact elements 9.

In a following method step 32, a first trench 14 is produced right through the carrier substrate 1 and through the first polysilicon layer 7 in the direction of the transducer element 10 by means of trenching. A main direction of extension 16 of the first trench 14 here runs substantially perpendicular to the first surface 3 of the first carrier substrate 1. The first trench 14 extends here as far as the second passivation layer 5, such that an oscillatable transducer plate 19 of the micro-electromechanical oscillatory system is produced adjoining the first trench 14 by means of the second polysilicon layer 11. The first and second passivation layers 3 and 5 respectively serve as etch stop layers and take the form of silicon oxide layers.

In a following method step 33, the second passivation layer 5 is completely removed within the channel 14.

The first trench 14 of the piezoelectric micromachined ultrasonic transducer 20*a* produced widens out in the form of a funnel until the first polysilicon layer 7 is reached.

Figure 2:
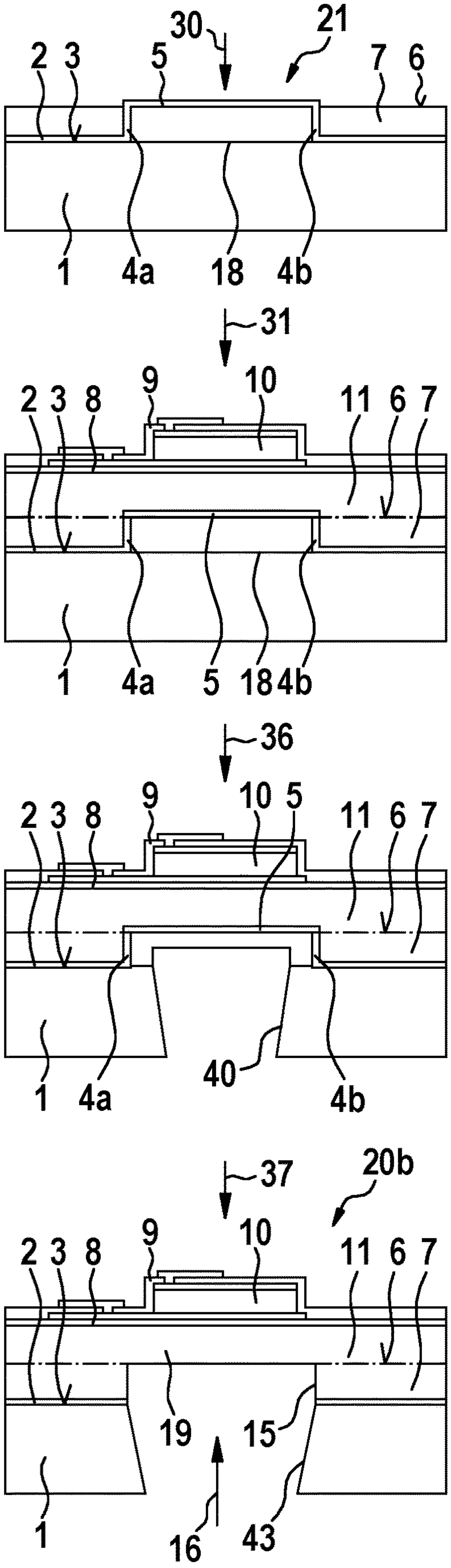
FIG. 2 shows a second embodiment of a method for producing a micro-electromechanical oscillatory system, according to the present invention.

FIG. 2 is a schematic representation of a second embodiment of a method for producing a micro-electromechanical oscillatory system in the form of a piezoelectric micromachined ultrasonic transducer 20*b*. Unlike the embodiment in FIG. 1, in a method step 36 following method step 31 first of all a trenching step is performed with a fourth trench mask (not shown here) to produce the first trench 43. The trench mask has a fourth opening of a size, in particular a diameter, which is significantly smaller than the size of a length of the transducer plate 19 to be produced. The trenching step extends into the first polysilicon layer 7 but does not reach the second passivation layer 5. In a following method step 37, the first trench 43 is enlarged in an isotropic silicon etching step until the second passivation layer 5 is reached. The second passivation layer 5 is then removed.

Figure 3:
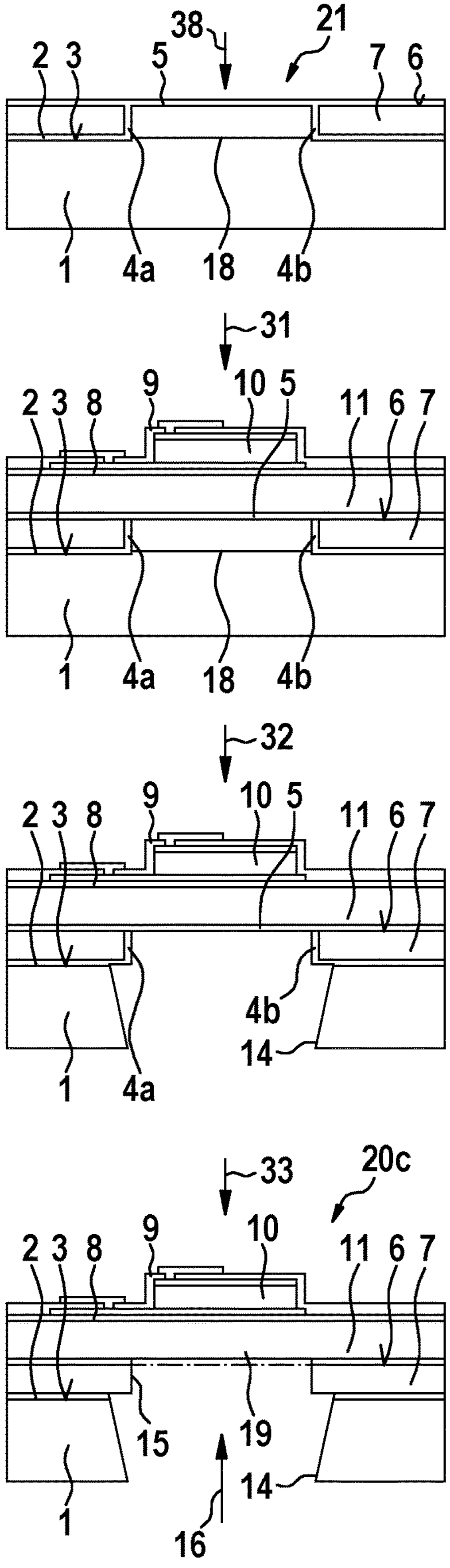
FIG. 3 shows a third embodiment of a method for producing a micro-electromechanical oscillatory system, according to the present invention.

FIG. 3 is a schematic representation of a third embodiment of a method for producing a micro-electromechanical oscillatory system in the form of a piezoelectric micromachined ultrasonic transducer 20*c*. Unlike in the embodiments described above, in a first method step 38, the second passivation layer is here allowed to remain over the entire surface. This embodiment is advantageous for electrical isolation between transducer plate 19 and carrier substrate 1.

Figure 4:
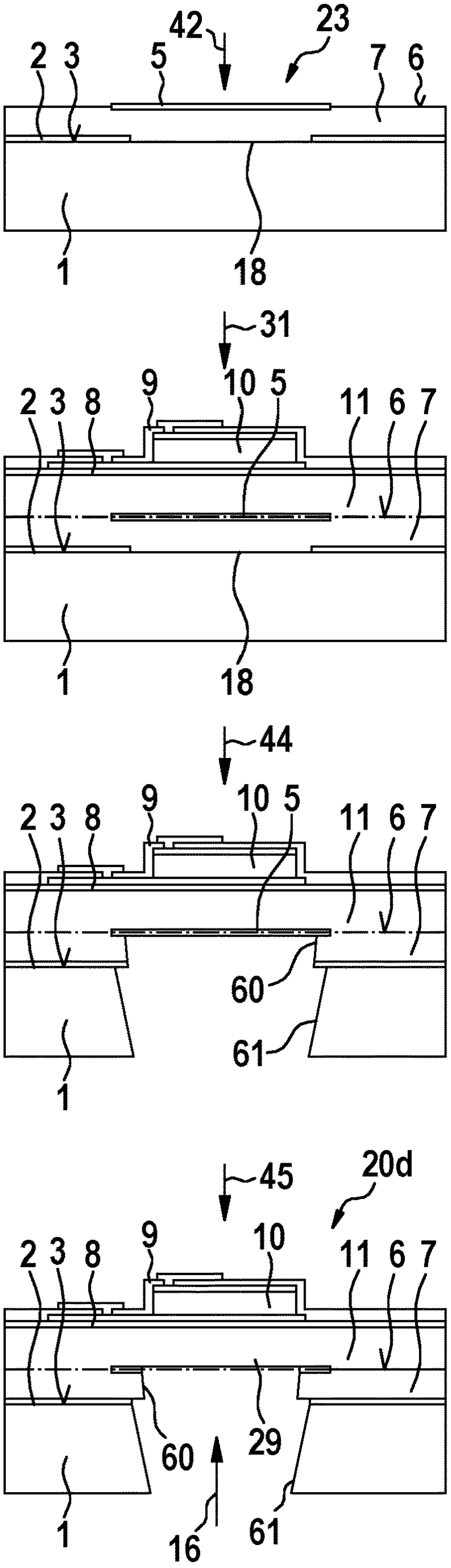
FIG. 4 shows a fourth embodiment of a method for producing a micro-electromechanical oscillatory system, according to the present invention.

FIG. 4 is a schematic representation of a fourth embodiment of a method for producing a micro-electromechanical oscillatory system in the form of a piezoelectric micromachined ultrasonic transducer 20*d*. Here, unlike in the above-described embodiments, the second circumferential trench is omitted in method step 42. This results in just the first passivation layer 2 on the first surface and the second passivation layer 5 on the second surface. In a method step 44 following method step 31, the first passivation layer 2 serves, on trenching of the first trench 61, as a type of aperture through which the trench then extends until the second passivation layer 5 is reached. Since the first channel 61 or the wall 60 of the first channel 61 is then widened more in the region of the first polysilicon layer 7 than in the above-described embodiments, in this case the first sub-region 23 of the second passivation layer 5 is also broader than in the above-described embodiments. In a method step 45 following method step 44, the second passivation layer 5 is completely removed within the channel 61. This method offers the advantage of simple and inexpensive implementation, wherein the accuracy of the dimensions of the transducer plate 29 to be produced is still high.

Figure 5:
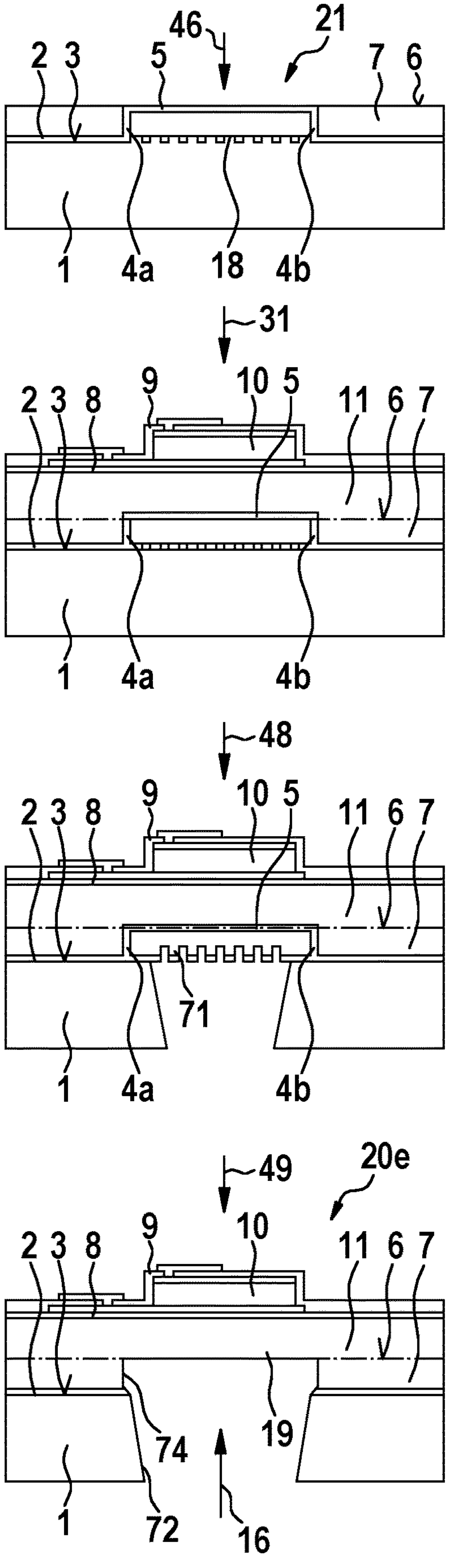
FIG. 5 shows a fifth embodiment of a method for producing a micro-electromechanical oscillatory system, according to the present invention.

FIG. 5 is a schematic representation of a fifth embodiment of a method for producing a micro-electromechanical oscillatory system in the form of a piezoelectric micromachined ultrasonic transducer 20*e*. Unlike the above-described embodiments, in method step 46, the first passivation layer 3 is here formed in the region of the second sub-region 18 with perforations or a grating. In a method step 48 following method step 31, the trench for producing the first channel 72 initially extends almost completely through the carrier substrate 1 and through the perforations or grating of the first passivation layer 3, In the course of method step 48, when the perforated second sub-region 18 is reached is identifiable and is used to terminate trenching. Narrow webs 71 arise within the first polysilicon layer 2. In a following method step 49, the first channel with the wall 74 is then produced entirely by means of silicon sacrificial layer etching. This embodiment offers the advantage that the first passivation layer can be made very thin.

What is claimed is:

1. A method for producing a micro-electromechanical oscillatory system, the method comprising the following method steps:

providing a carrier substrate with a first surface;

applying a first passivation layer onto the first surface of the first carrier substrate;

epitaxially growing a first polysilicon layer on top of the first passivation layer and/or the first surface of the carrier substrate;

applying a second passivation layer onto a second surface of the first polysilicon layer, the second surface being oriented substantially parallel to the first surface of the first carrier substrate;

epitaxially growing a second polysilicon layer on top of the second surface of the first polysilicon layer and/or the second passivation layer;

arranging a transducer element of the micro-electromechanical oscillatory system on a third surface of the second polysilicon layer, the third surface being oriented substantially parallel to the first surface of the first carrier substrate; and producing a first trench through the carrier substrate and through the first polysilicon layer in a direction of the transducer element, the first trench extending as far as the second passivation layer such that an oscillatable transducer plate of the micro-electromechanical oscillatory system is produced adjoining the first trench using the second polysilicon layer.

2. The method as recited in claim 1, wherein the micro-electromechanical oscillatory system is a piezoelectric micromachined ultrasonic transducer.

3. The method as recited in claim 1, wherein, following the step of epitaxially growing the first polysilicon layer on top of the first passivation layer and/or the first surface of the carrier substrate, a circumferential second trench, produced by trenching, is produced through the first polysilicon layer, an area of the second surface enclosed by the circumferential second trench having, in plan view, a defined shape and size of the oscillatable transducer plate to be produced.

4. The method as recited in claim 3, wherein, during the step of applying the second passivation layer onto the second surface of the first polysilicon layer, the second circumferential trench becomes filled at least in part with the second passivation layer and is closed by the second passivation layer at an upper end of the second trench.

5. The method as recited in claim 4, wherein the second trench extends as far the first passivation layer.

6. The method as recited in claim 1, wherein, following application of the second passivation layer onto the second surface of the first polysilicon layer, the second passivation layer is removed in part using a first etching mask such that the second passivation layer remains only in a contiguous first sub-region of the second passivation layer, the first sub-region having, in plan view, a shape and size including length, which correspond to the oscillatable transducer plate to be produced.

7. The method as recited in claim 1, wherein, following application of the first passivation layer onto the first surface of the first carrier substrate, the first passivation layer is removed in a second sub-region of the first passivation layer using a second etching mask, the second sub-region of the first passivation layer having a shape and an area which correspond to the oscillatable transducer plate produced.

8. The method as recited in claim 1, wherein, in the step of producing the first trench, a trenching step is performed, in which a fourth opening of a fourth trench mask has a a diameter which is smaller than a size of an area of the transducer plate, the first trench being enlarged in a following isotropic silicon etching step, until the second passivation layer is reached.

9. The method as recited in claim 1, wherein the first and/or the second passivation layer serve as etch stop layers.

10. The method as recited in claim 1, wherein the first and/or the second passivation layers is a silicon oxide layer.

11. The method as recited in claim 1, wherein, following production of the first trench the first and second passivation layers are removed at least in part.

12. A piezoelectric micromachined ultrasonic transducer, comprising:

a carrier substrate of silicon;

a first polysilicon layer;

a second polysilicon layer;

a first passivation layer;

a transducer element; and an oscillatable transducer plate;

wherein the carrier substrate has a first surface, on which the first polysilicon layer is at least in part arranged, the first surface of the carrier substrate and the first polysilicon layer being separated from one another at least in part by the first passivation layer, the first polysilicon layer having a second surface, the second surface being oriented substantially parallel to the first surface of the first carrier substrate, the second polysilicon layer being arranged on the second surface, the transducer element including a piezo element, of the piezoelectric micromachined ultrasonic transducer being arranged on a third surface of the second polysilicon layer, the third surface being oriented substantially parallel to the first surface of the first carrier substrate, a first trench extending in a direction of the transducer element through the carrier substrate and the first polysilicon layer as far as the second polysilicon layer such that the oscillatable transducer plate is formed, directly adjoining the first trench.

13. The piezoelectric micromachined ultrasonic transducer as recited in claim 12, wherein the first trench has a main direction of extension which is oriented substantially perpendicular to the first surface of the first carrier substrate.

14. The piezoelectric micromachined ultrasonic transducer as recited in claim 12, wherein the first trench has a smaller diameter in a region of the first polysilicon layer than in a region of the carrier substrate.

15. The piezoelectric micromachined ultrasonic transducer as recited in claim 12, wherein the first polysilicon layer has a first thickness in a range from 10 μm to 80 μm, and the second polysilicon layer has a second thickness in a range from 2 μm to 80 μm.

* * * * *